United States Patent
Liaw

(10) Patent No.: US 11,728,382 B2
(45) Date of Patent: Aug. 15, 2023

(54) GATE ALL AROUND TRANSISTORS WITH DIFFERENT THRESHOLD VOLTAGES

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/815,171

(22) Filed: Jul. 26, 2022

(65) Prior Publication Data

US 2022/0359661 A1    Nov. 10, 2022

Related U.S. Application Data

(62) Division of application No. 16/571,289, filed on Sep. 16, 2019, now Pat. No. 11,495,662.

(51) Int. Cl.
*H01L 29/10* (2006.01)
*H01L 21/8238* (2006.01)
*H01L 29/78* (2006.01)
*H01L 27/092* (2006.01)
*H01L 29/66* (2006.01)

(52) U.S. Cl.
CPC .. *H01L 29/1037* (2013.01); *H01L 21/823807* (2013.01); *H01L 21/823821* (2013.01); *H01L 27/0924* (2013.01); *H01L 29/66795* (2013.01); *H01L 29/785* (2013.01)

(58) Field of Classification Search
CPC combination set(s) only.
See application file for complete search history.

(56) References Cited

U.S. PATENT DOCUMENTS

| | | | |
|---|---|---|---|
| 9,613,953 B2 | 4/2017 | Liaw | |
| 9,793,273 B2 | 10/2017 | Liaw | |
| 9,805,985 B2 | 10/2017 | Liaw | |
| 10,490,559 B1 | 11/2019 | Ando | |
| 2018/0114727 A1 | 4/2018 | Rodder | |
| 2019/0378906 A1* | 12/2019 | Loubet | H01L 21/823857 |
| 2020/0235133 A1* | 7/2020 | Xiao | H01L 29/78696 |
| 2020/0279777 A1* | 9/2020 | Zhang | H01L 27/088 |

* cited by examiner

*Primary Examiner* — Ratisha Mehta
(74) *Attorney, Agent, or Firm* — Haynes and Boone, LLP

(57) ABSTRACT

Semiconductor devices and methods are provided. A semiconductor device according to the present disclosure includes a first gate-all-around (GAA) transistor having a first plurality of channel members, and a second GAA transistor having a second plurality of channel members. A pitch of the first plurality of channel members is substantially identical to a pitch of the second plurality of channel members. The first plurality of channel members has a first channel member thickness (MT1) and the second plurality of channel members has a second channel member thickness (MT2) greater than the first channel member thickness (MT1).

20 Claims, 13 Drawing Sheets

GATE ALL AROUND TRANSISTORS WITH DIFFERENT THRESHOLD VOLTAGES

PRIORITY

This application is a divisional application of U.S. patent application Ser. No. 16/571,289, filed Sep. 16, 2019, the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanowires (which extend horizontally, thereby providing horizontally-oriented channels) vertically stacked. Such GAA transistor can be referred to as a vertically-stacked horizontal GAA (VGAA) transistor.

IC devices require different transistors with different threshold voltages (Vt) to serve different functions appropriately. For example, transistors for logic devices may require fast speed and high drive current while transistors for memory devices may require low leakage. Although existing GAA transistors and processes are generally adequate for fabricating transistors with different threshold voltages, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
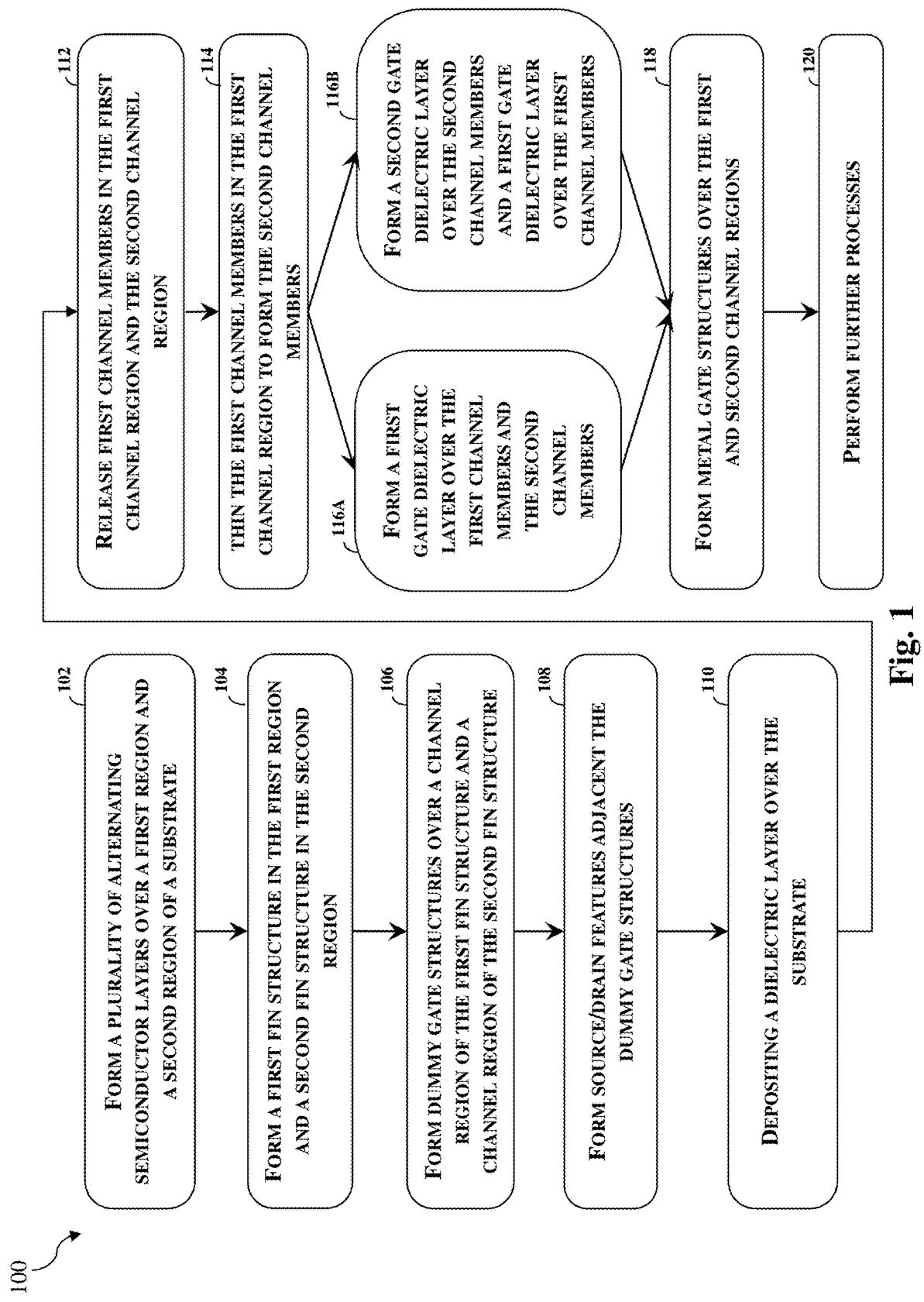
FIG. 1 is a flowchart illustrating a method of forming a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates to GAA transistors, and more particularly, to GAA transistors having different threshold voltages. Conventionally, transistors with different threshold voltages are realized by implementing multiple work-function metal schemes. Implementing multiple work-function metal schemes requires depositing a work-function metal stack, selectively removing the work-function metal stack, and re-depositing another work-function metal stack. While this conventional technique works fine in FinFETs, it may not work as well in GAA transistors because of the reduced vertical space between GAA channel members. A semiconductor device according to embodiments of the present disclosure includes a first-type GAA transistor with thin channel members and thick gate dielectric layers and a second-type GAA transistor with thick channel members and thin gate dielectric layers. If further threshold voltage variations are desired, different work-function metal layers can be implemented. Both the first-type GAA transistor and the second-type GAA transistor are fabricated from one epitaxial semiconductor stack. The first-type GAA transistor has a higher threshold voltage due to better drain-induced-barrier-lowering (DIBL) and is suitable for applications that require low leakage, such as memory application. Due to the thick gate dielectric layer, the first-type GAA transistor may also be suitable for high-voltage applications, such as input/output (I/O) application. The second-type GAA transistor has a lower threshold voltage and is suitable for applications that require speed and a high drive current ($I_{on}$), such as logic application. As used herein, a difference between a high (or higher) threshold voltage and a low (or lower) threshold voltage is equal to or greater than about 20 mV.

FIG. 1 illustrates a flow chart of a method 100 for fabricating a semiconductor device according to various aspects of the present disclosure. FIG. 1 will be described below in conjunction with FIGS. 2-10, 11A, 11B, and 12, which are fragmentary cross-sectional views of a workpiece at various stages of fabrication according to method 100 in FIG. 1 before the semiconductor device is fabricated on the workpiece. Throughout the present disclosure, for the ease of reference, the workpiece and the semiconductor device may be referred to interchangeably as the workpiece is to become the semiconductor device at the conclusion of the processes and may share the same reference numeral. Additional steps can be provided before, during, and after method 100, and some of the steps described can be moved, replaced, or eliminated for additional embodiments of method 100. Additional features can be added in the semiconductor device depicted in FIGS. 2-10, 11A, 11B, and 12 and some of the features described below can be replaced, modified, or eliminated in other embodiments of the semiconductor device.

Figure 2:
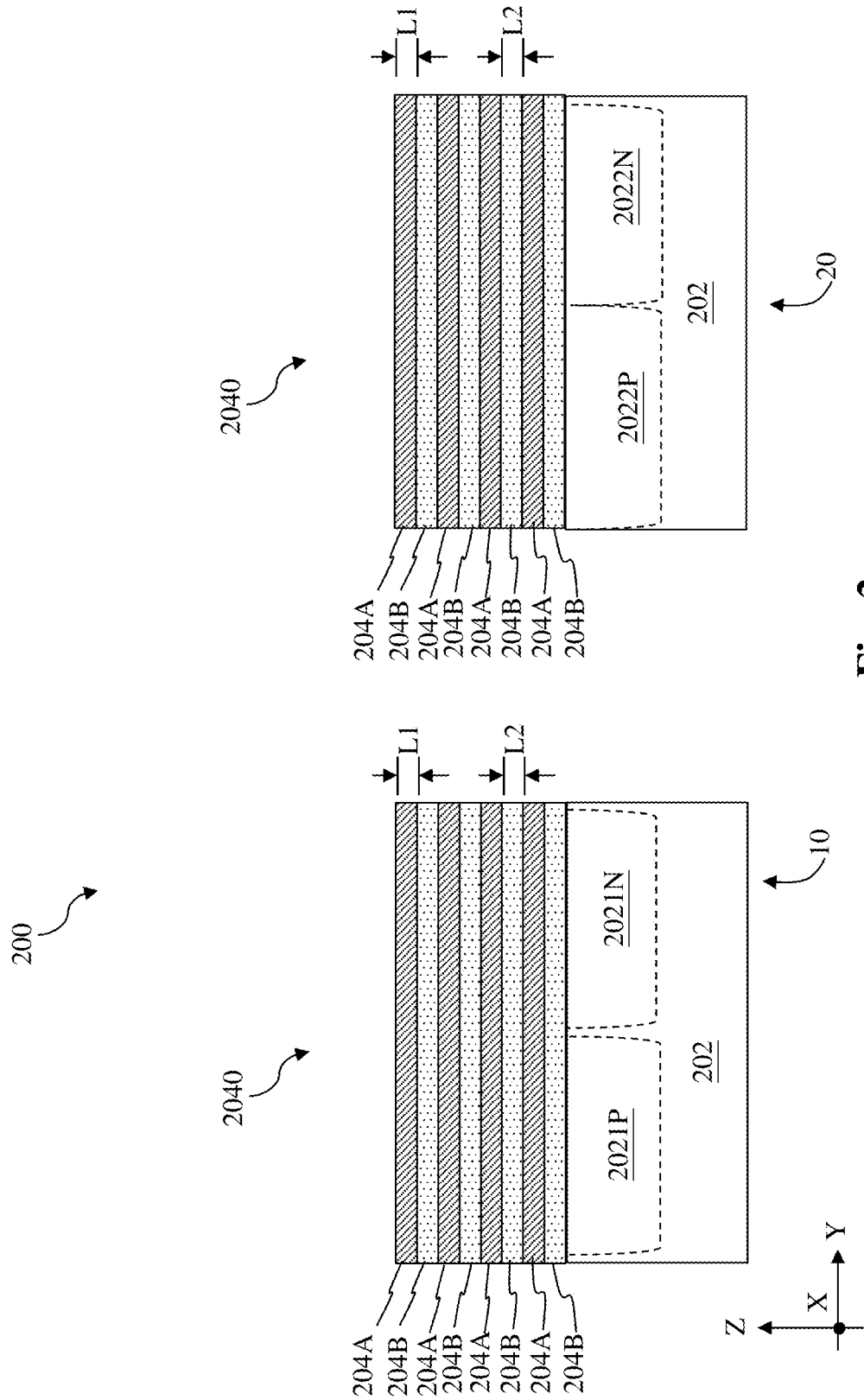
FIGS. 2-10, 11A, 11B, and 12 illustrate fragmentary cross-sectional views of a workpiece at various stages of fabrication, according to various aspects of the present disclosure.

Referring now to FIGS. 1 and 2, the method 100 includes a block 102 where a plurality of alternating semiconductor layers 2040 over a first region 10 and a second region 20 of a substrate 202 in a workpiece 200. In some embodiments, the substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 202 includes one or more group III-V materials, one or more group II-IV materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions (or wells) configured according to design requirements of semiconductor device 200, such as p-type doped regions (or p-wells) 2021P and 2022P, and n-type doped regions (or n-wells) 2021N and 2022N, or combinations thereof. P-type doped regions, such as 2021P and 2022P, include p-type dopants, such as boron, indium, other p-type dopant, or combinations thereof. N-type doped regions, such as 2021N and 2022N, include n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions. In some embodiments, p-type GAA devices are formed over n-type wells and n-type GAA devices are formed over p-type wells. Depending on design requirements, the n-well 2021N in the first region 10 may be different from n-well 2022N in the second region 20 in terms of dopants or doping concentrations. Similarly, p-well 2021P in the first region 10 may be different from p-well 2022P in the second region 20.

The first region 10 and the second region 20 are device regions that include transistors meeting different requirements or serving different functions. In some embodiments, the first region 10 may be a region of low leakage transistors. For example, the first region 10 may be a memory device region that includes static random access memory (SRAM), dynamic random access memory (DRAM), or Flash devices. The second region 20 may be a region for high performance transistors that require high drive currents ($I_{on}$) and/or fast switching speed. For example, the second region 20 may be a logic device region that includes an inverter, NAND, NOR, AND, OR, or Flip-Flop device. To meet respective performance or power consumption requirements, GAA transistors in the first region 10 may have channel members thinner than channel members in the GAA transistors in the second region 20. In addition, GAA transistors in the first region 10 may have thicker gate dielectric layers than gate dielectric layers of GAA transistors in the second region.

In the embodiments represented in FIG. 2, the plurality of alternating semiconductor layers 2040 includes a plurality of first semiconductor layers 204A interleaved by a plurality of the second semiconductor layers 204B. That is, two neighboring first semiconductor layers 204A sandwich one second semiconductor layer 204B. The plurality of first semiconductor layers 204A is formed of a first semiconductor material and the plurality of second semiconductor layers 204B is formed of a second semiconductor material that is different from the first semiconductor material. In some embodiments, the first semiconductor material is or consists essentially of silicon (Si) and the second semiconductor material is or consists essentially of germanium (Ge). The plurality of alternating semiconductor layers 2040 may be formed by depositing or epitaxially growing the plurality of first semiconductor layers 204A and the plurality of second semiconductor layers 204B alternatingly. In some implementations illustrated in FIG. 2, each of the plurality of first semiconductor layers 204A includes a first thickness L1 and each of the plurality of second semiconductor layers 204B includes a second thickness L2. In some instances, a ratio of the first thickness L1 to the second thickness L2 (L1/L2) is between about 0.5 and about 2.0. In some implementations, after the plurality of alternating semiconductor layers 2040 is patterned into fin structures (fin-shaped active regions), a portion of the plurality of the second semiconductor layers 204B in channel regions may be selectively removed to release channel members formed from the plurality of the first semiconductor layers 204A. In this regard, the second semiconductor layers 204B function as sacrificial semiconductor layers and may be referred to as so.

Figure 3:
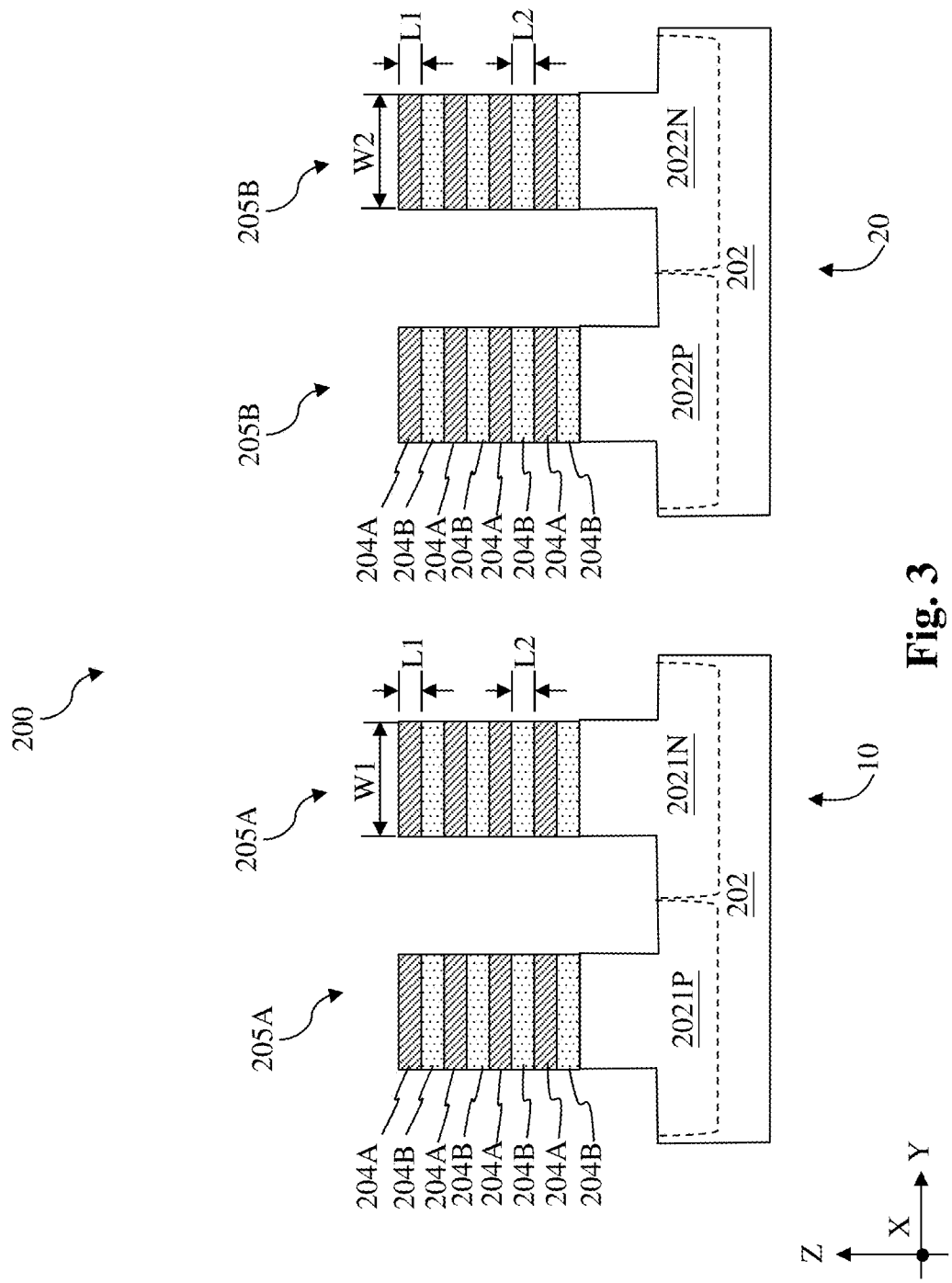

Referring now to FIGS. 1 and 3, the method 100 includes a block 104 where a first fin structure 205A is formed in the first region 10 and a second fin structure 205B is formed in the second region 20. In some embodiments represented in FIG. 3 the plurality of alternating semiconductor layers 2040 over the first region 10 may be patterned to form the first fin structures (or first fin-shaped active regions) 205A and the plurality of alternating semiconductor layers 2040 over the second region 20 may be patterned to form the second fin structures (or second fin-shaped active regions) 205B. At block 104, the first fin structures 205A and the second fin structures 205B may be patterned by using suitable processes such as photolithography and etching processes. In some embodiments, the first and second fin structures 205A and 205B are etched from the respective alternating semiconductor layers using dry etch or plasma processes. In some other embodiments, the first and second fin structures 205A and 205B can be formed by a double-patterning lithography (DPL) process, a quadruple-patterning lithography (QPL) process or a multiple-patterning lithography (MPL) process. Generally, DPL, QPL and MPL processes combine photolithography and self-aligned processes, allowing patterns to be created that have, for example, pitches smaller than what is otherwise obtainable using a single, direct photolithography process. As shown in FIG. 3, the first fin structures 205A may extend from respectively doped regions, including the p-type doped region 2021P and n-type doped region 2021N in the first region 10 and the second fin structures 205B may extend from respective doped regions, including the p-type doped region 2022P and n-type doped region 2022N in the second region 20. As illustrated in FIG. 3, in some embodiments, the substrate 202 is also etched at block 104.

In some alternative embodiments, the first fin structures 205A and the second fin structure 205B may have different widths along the Y direction along which the gate structures extend. In some implementations, each of the first fin structures 205A has a first width W1 and each of the second fin structures 205B has a second width W2 that is different from the first width W1. In some embodiments, a ratio of the first width W1 to the second width W2 is between about 1.3 and about 10. In some other embodiments, a ratio of the second width W2 to the first width W1 is between 1.3 and about 10, including between about 1.5 and about 4. The first width W1 and the second width W2 are selected based on different requirements of drive currents and threshold voltages. Given the same channel member thickness, a cross-sectional area of the channel is proportional to the width of the channel members.

Figure 4:
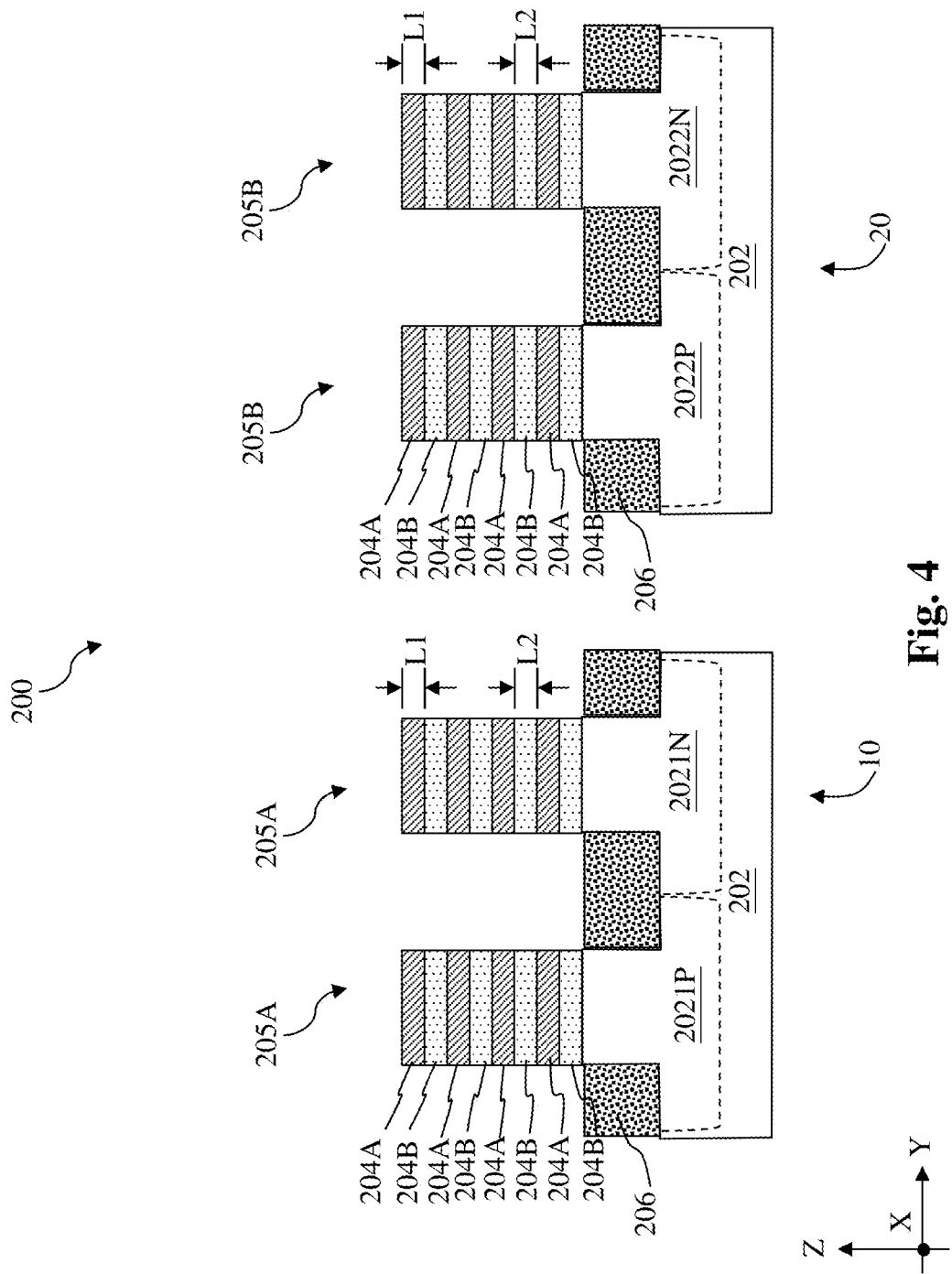

Reference is now made to FIG. 4. In some embodiments, dielectric isolation features 206 are formed by depositing a dielectric material in the recess between neighboring fin structures and then pulling back the deposited dielectric material to expose the plurality of alternating semiconductor layers 2040. The dielectric isolation features 206 may also be referred to as shallow trench isolation (STI) features 206.

Figure 5:
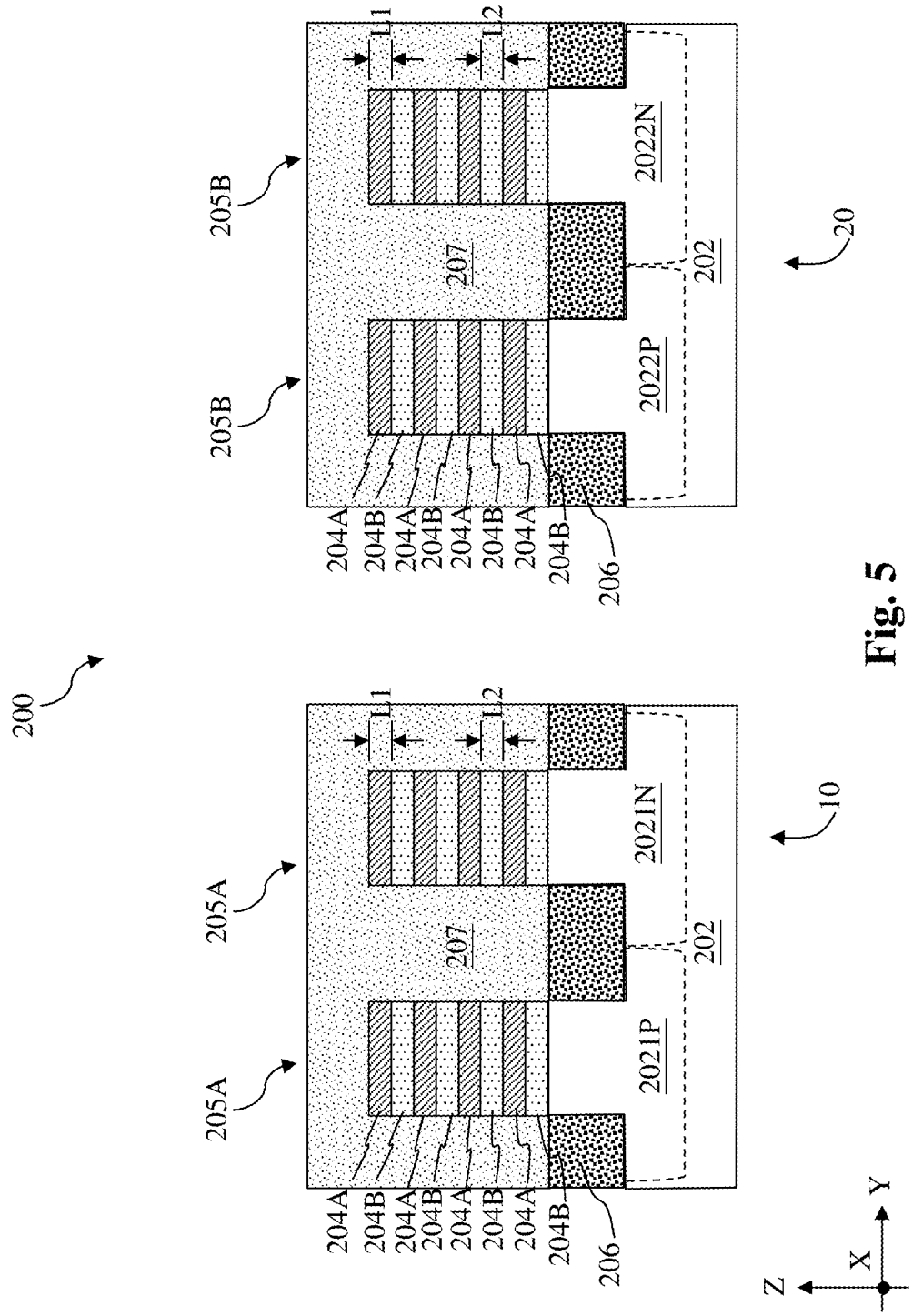

Referring FIGS. 1 and 5, the method 100 includes a block 106 where dummy gate structures 207 are formed over a channel region of the first fin structures 205A structure and a channel region of the second fin structures 205B. In this regard, FIG. 5 illustrates fragmentary cross-sectional view of the workpiece 200 in the first region 10 and the second region 20 across the respective channel regions. In some embodiments, a gate-last process flow is adopted and the dummy gate structures 207 are first formed as placeholders for the metal gate structures 208 (shown in FIG. 11A; alternatively for a first gate structure 209-1 and a second gate structure 209-2 shown in FIG. 11B) to be formed at a later point. Because the metal gate structures 208 are formed later the process to replace the dummy gate structures 207, damages to the metal gate structures 208 from various processes may be averted. In some implementations, a dummy gate dielectric layer (not shown) may also be formed between the dummy gate structures 207 and the first fin structures 205A or between the dummy gate structures 207 and the second fin structures 205B. The dummy gate structures 207 may be formed of polysilicon. In some embodiments, a gate top hard mask layer 212 may be formed over the dummy gate structure 207.

In some embodiments, one or more gate spacers (or gate spacer layers) 220 (shown in FIG. 12) are formed over the dummy gate structure 207. The one or more gate spacers 220 are disposed over and along side surfaces (or sidewalls) of the dummy gate structure 207. The one or more spacers 220 may provide isolation between the metal gate structure 208 (after the gate replacement process) and neighboring source/drain contacts and may also protect structures adjacent to the dummy gate structure 207 when the dummy gate structure 207 is removed at a later time. In some embodiments, one or more dielectric dummy gate structures 218 (shown in FIG. 12) may be formed along with the dummy gate structures 207 to separate fin structures into multiple segments or to separate cells of semiconductor devices. In some embodiments, each of the one or more gate spacers may include one or more dielectric materials selected from a group consisting of silicon oxide, silicon oxynitride, silicon nitride, silicon oxycarbonitride, a low-k dielectric material with a dielectric constant lower than 4, or a combination thereof.

Figure 6:
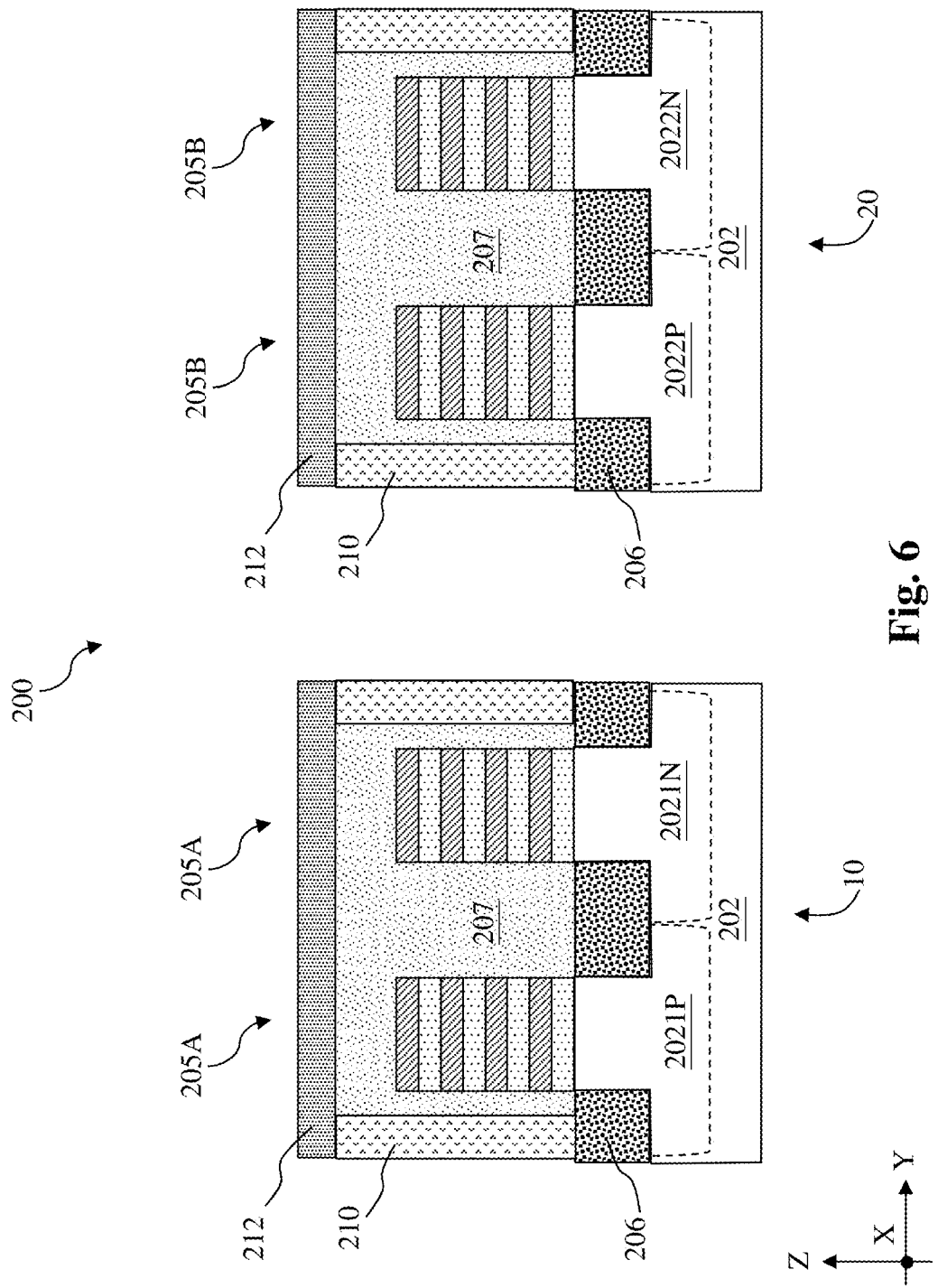

In some embodiments, the dummy gate structure 207 in FIG. 6 may undergo a dummy gate cut process, resulting in gate end dielectric features, such as the gate end dielectric features 210 shown in FIGS. 7A and 7B. Although only the dummy gate structure 207 is separated into more than one segment in the dummy gate cut process, the gate end dielectric feature 210 may serve as separation features to divide the metal gate structure 208 into segments.

Figure 12:
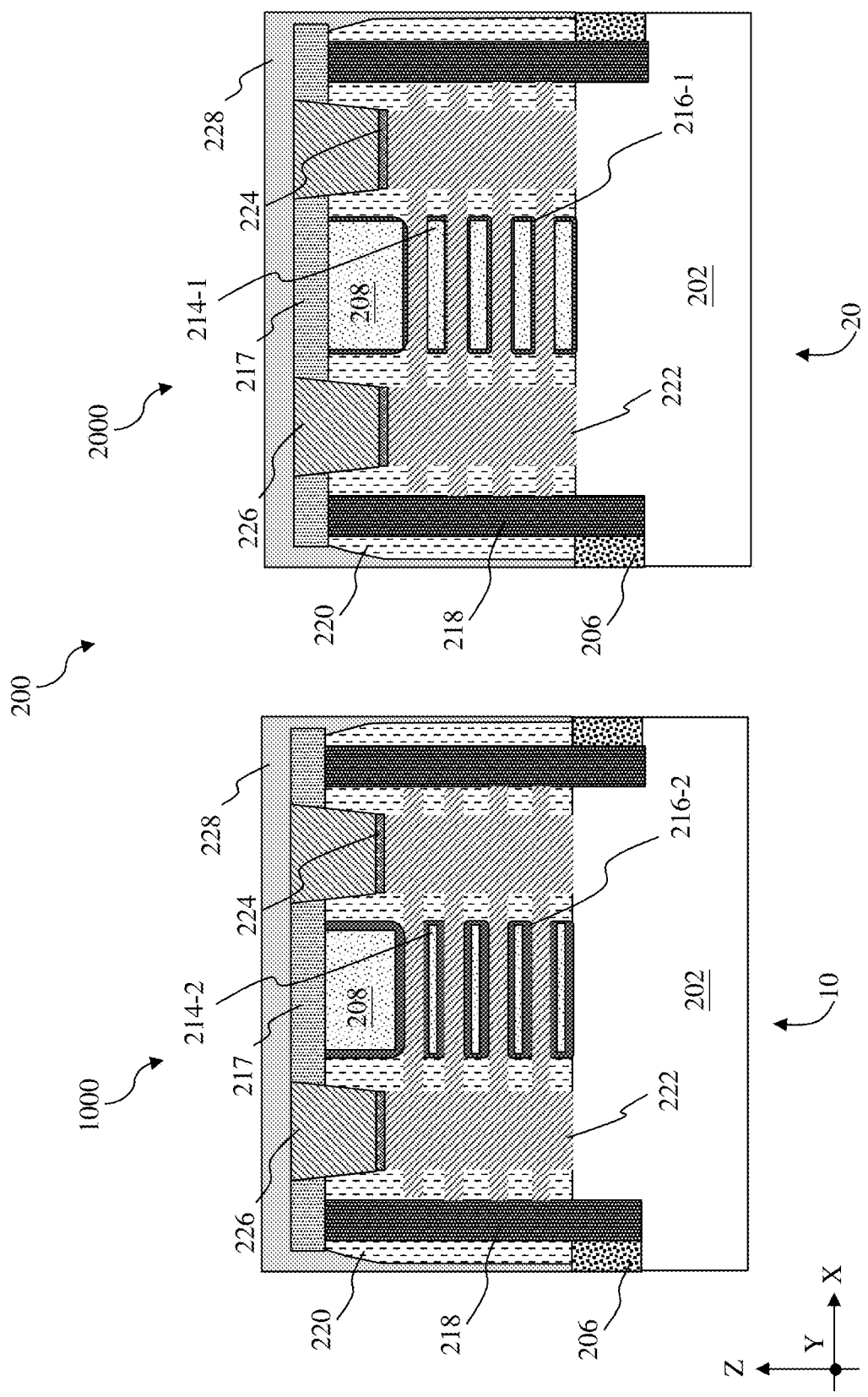

Referring to FIG. 1, the method 100 includes a block 108 where source/drain features 222 are formed adjacent the dummy gate structures 207. While FIG. 12 is mainly for illustration of further processes that may be performed to the workpiece 200 at block 120, it illustrates relative positions and structures of source/drain features 222 formed at block 108 of the method 100. In some embodiments, source/drain regions of the first fin structures 205A and the second fin structures 205B in FIG. 6 are recessed to expose the sidewalls of the channel regions of the first fin structures 205A and the second fin structures 205B. In some implementations, the plurality of the second semiconductor layers 204B of the first fin structure 205A and the second fin structure 205B may be partially and selectively etched to form recesses. A spacer dielectric material may then be deposited over the workpiece 200, including within the recesses. The deposited spacer dielectric material is then pulled back to form inner spacers in the recesses such that the plurality of the first semiconductor layers 204A of the first fin structures 205A and the second fin structures 205B are exposed. That is, the plurality of the first semiconductor layers 204A of the first fin structures 205A and the second fin structures 205B are partially separated by the inner spacers at either ends along the length of the channel. Then, n-type semiconductor materials, such as phosphorous-doped silicon (SiP), carbon-doped silicon (SiC), arsenic-doped silicon (SiAs), silicon (Si), or a combination thereof or p-type semiconductor materials, such as silicon germanium (SiGe), carbon-doped silicon germanium (SiGeC), germanium (Ge), or a combination thereof, may be epitaxially formed in the source/drain regions on the substrate 202 and the plurality of first semiconductor layers 204A to form the source/drain features 222. Although not separately shown, the source/drain features 222 may include n-type source/drain features formed from the aforementioned n-type semiconductor materials and the p-type source source/drain features formed from the aforementioned p-type semiconductor materials. The n-type source/drain features and p-type source/drain features may be formed sequentially and separately using photolithography techniques and more than one mask. For example, the n-type source/drain features may be formed first while the p-type source/drain regions are covered by a photolithographically patterned hard mask and then the p-type source/drain features may be formed while the n-type source/drain regions are covered by another photolithographically patterned hard mask. In some other examples, the p-type source/drain features may be formed first.

Referring to FIG. 1, the method 100 includes a block 110 where a dielectric layer (not shown) is formed over the substrate 202. The dielectric layer may be referred to as an interlayer dielectric (ILD) layer. In some embodiments, the dielectric layer may include silicon oxide, tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In some implementations, the dielectric layer may be formed over the workpiece 200 using CVD, flowable CVD (FCVD), or spin-on-glass. In some instances, block 110 may further include a planarization process to planarize a top surface of the dielectric layer before further processes.

Figure 7:
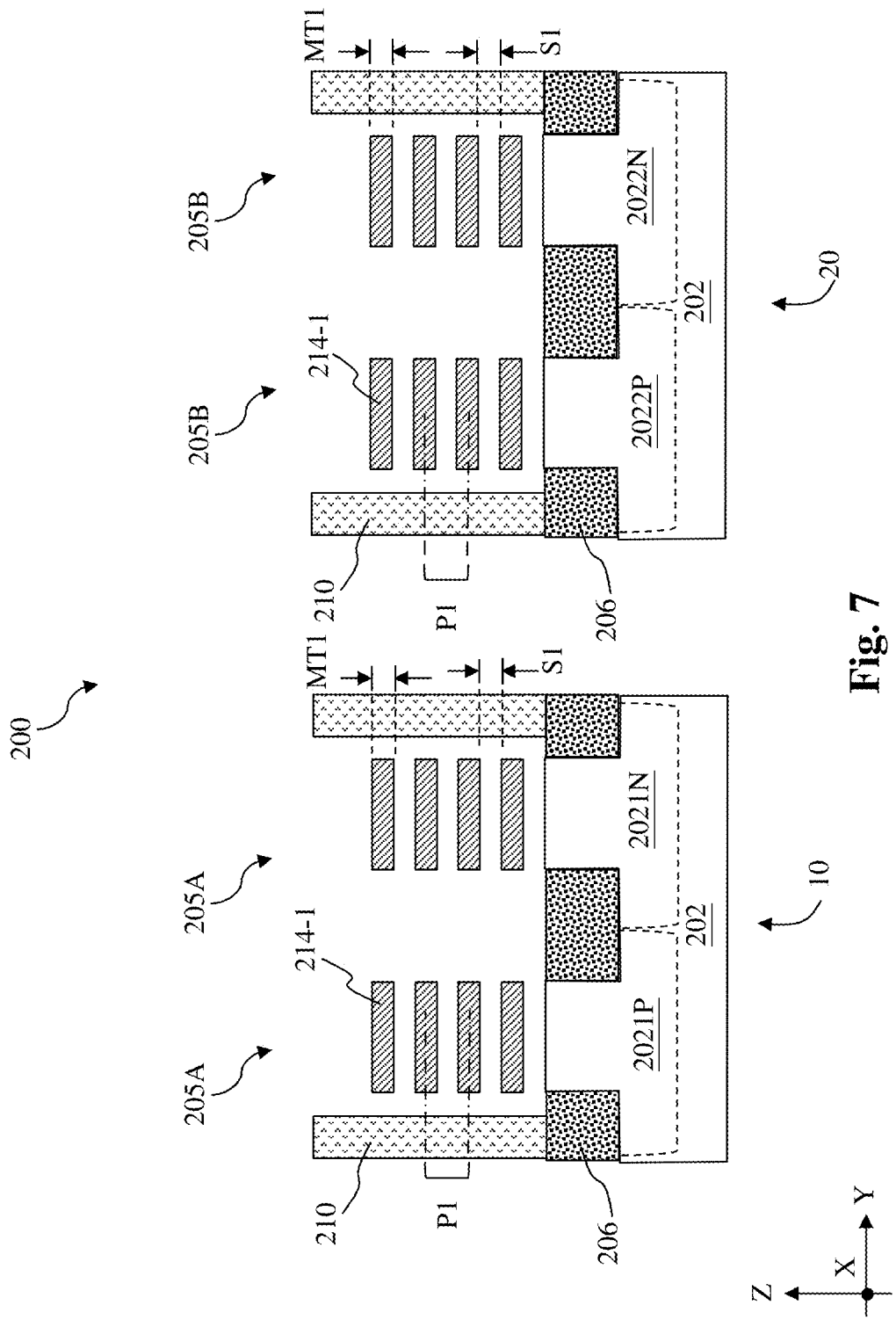

Referring to FIGS. 1 and 7, the method 100 includes a block 112 where first channel members 214-1 in the channel region of the first fin structure 205A and the second fin structure 205B are released. In some embodiments, at block 112, the dummy gate structures 207 in the channel regions of the first fin structure 205A and the second fin structure 205B are removed to expose the channel regions of the first fin structures 205A and the second fin structures 205B. Then the exposed channel regions of the first fin structures 205A and the second fin structures 205B are subject to a selective etching process to selectively remove the plurality of second semiconductor layers 204B. After the plurality of second semiconductor layers 204B are removed, the first semiconductor layers 204A in the first fin structures 205A and the second fin structures 205B are released to become first channel members 214-1. In some implementations, the plurality of second semiconductor layers 204B is formed of silicon germanium. In those implementations, the plurality of second semiconductor layers 204B may be first oxidized by an oxidizer, such as ozone, and then removed by a selective etch process that is selective to silicon germanium oxide. The first channel members 214-1 include a first pitch P1 based on middle lines of each of the first channel members 214-1 along the Z direction. In some instances, the first pitch P1 may be between about 10 nm and about 22 nm. Each of the first channel members 214-1 has a first member thickness MT1. In some instances, the first member thickness MT1 may between about 4.5 nm and about 8.5 nm. Any two of the neighboring first channel members 214-1 is separated by a first spacing S1. In some instances, the first spacing S1 may be between about 5.5 nm and about 13.5 nm. The first pitch P1 may also be defined as a summation of the first member thickness MT1 and the first spacing S1.

Figure 8:
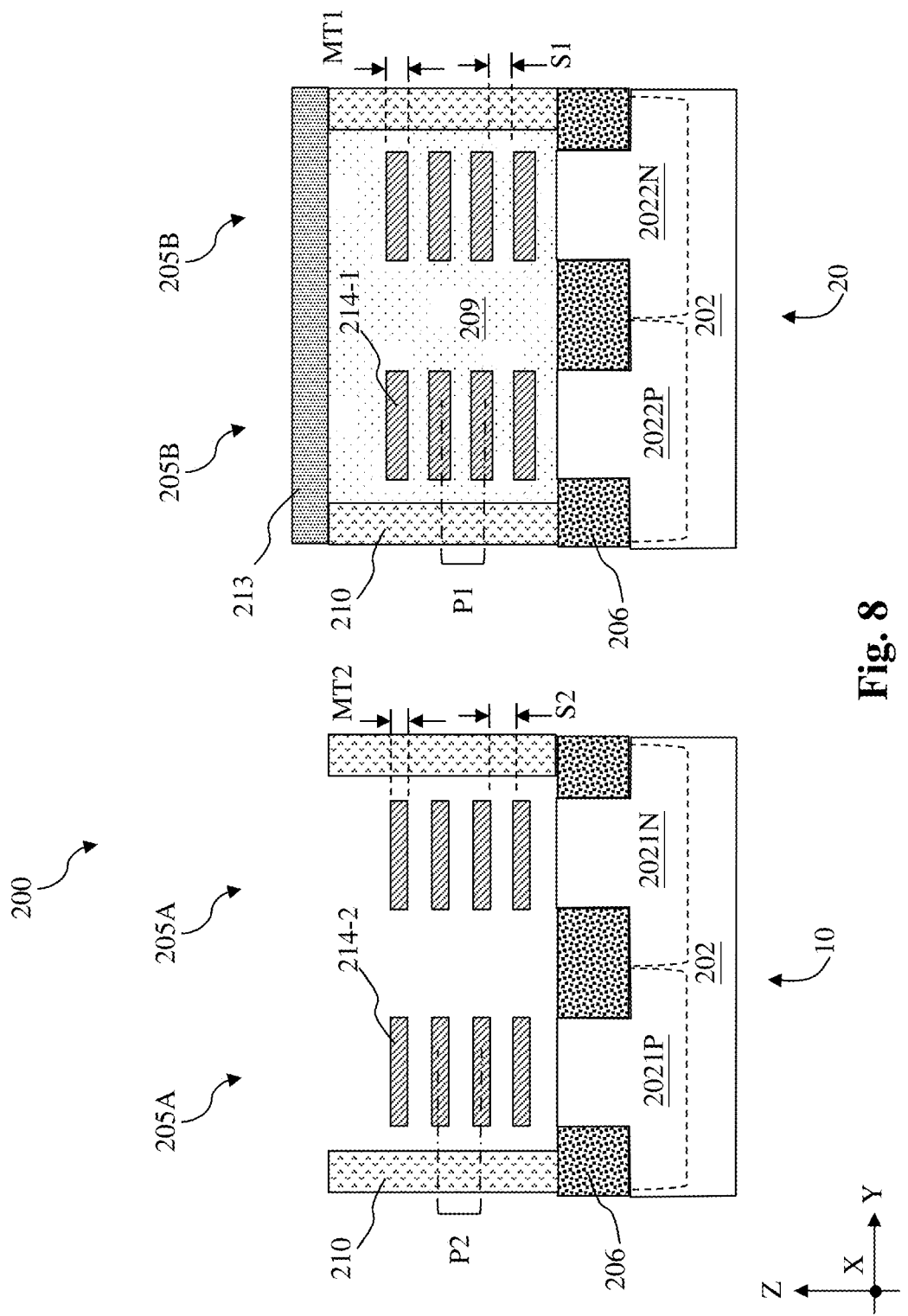

Referring to FIGS. 1 and 8, the method 100 includes a block 114 where first channel members 214-1 in the first region 10 are thinned to become second channel members 214-2. In some embodiments, the first channel members 214-1 in the second region 20 are masked while the first channel members 214-1 in the first region 10 are thinned at block 114. In an embodiment illustrated in FIG. 8, a dielectric filler material 209 may be deposited over the channel regions of the first region 10 and the second region 20 by a suitable process, such as spin-on coating. The dielectric filler material 209 is then planarized. Thereafter, one or more hard mask layers may be formed over the first region 10 and the second region 20. In some embodiments, the one or more hard mask layers may be formed of semiconductor oxide, such as silicon oxide, or semiconductor nitride, such as silicon nitride and may be deposited using chemical vapor deposition (CVD), flowable CVD (FCVD), spin-on coating, or other suitable technique. Thereafter, a photoresist layer is deposited over the one or more hard mask layers using CVD, FCVD, spin-on coating, or other suitable technique. The photoresist layer is then exposed to radiation reflected from or going through a patterned mask. After being subject to a post-exposure bake, the exposed photoresist layer may undergo chemical changes that allow the exposed or the unexposed portions of the photoresist layer to be removed by a developer to form a patterned photoresist layer. At block 114, the patterned photoresist layer may expose the one or more hard mask layers over the first region 10 while covering the one or more hard mask layers over the second region 20. The patterned photoresist layer may then be used as an etch mask to pattern the one or more hard mask layers to form a patterned hard mask 213. The patterned hard mask 213 covers the second region 20 and exposes the first region 10. The patterned hard mask may then be used as an etch mask to remove the dielectric filler material 209 in the channel regions in the first region 10 and etch the first channel members 214-1 to reduce their dimensions. The thinned first channel members 214-1 are now referred to as the second channel members 214-2. The present disclosure provides embodiments of varying threshold voltage levels in a semiconductor device by means of varying channel member thicknesses. It has been observed in experiments and simulations that when a channel member thickness of a GAA semiconductor device is between about 5 nm and about 6 nm, a threshold voltage of the GAA semiconductor device may change between about 40 mV and about 60 mV for every 1 nm change in the channel member thickness. For example, when the thickness of the channel member increases by about 1 nm, the threshold voltage may increase by between about 40 mV and about 60 mV. When the thickness of the channel member decrease by about 1 nm, the threshold voltage my decrease by between about 40 mV and about 60 mV. In addition, it has also been observed in experiments and simulations that the change of threshold voltage between about 40 mV and about 60 mV may translate into between about 12% and about 20% in drive current ratios. Given the present state of process controls and without changing other process parameters, a thickness change between about 0.5 nm and about 1.5 nm may be implemented to introduce a threshold voltage variation between about 20 mV and about 90 mV. In the embodiments represented in FIG. 8, the second channel members 214-2 now each have a second member thickness MT2 that is smaller than the first member thickness MT1. In embodiments where the first member thickness MT1 is between about 4.5 nm and about 8.5 nm, the second member thickness MT2 is between about 4 nm (4.5 nm minus 0.5 nm) and about 7 nm (8.5 nm minus 1.5 nm). In these embodiments, a ratio of MT2 to MT1 (MT2/MT1) may be between about 0.75 (≈5 nm/6.5 nm) and about 0.90 (≈5 nm/5.5 nm) and a ratio of MT1 to MT2 (MT1/MT2) may be between about 1.1 (≈5.5 nm/5 nm) and about 1.3 (≈6.5 nm/5 nm). The second channel members 214-2 include a second pitch P2. Because the middle lines of the second channel members 214-2 do not shift at block 114, the second pitch P2 may be identical or substantially identical to the first pitch P1. In some instances, a sum of the first member thickness MT1 and the first spacing S1 is identical or substantially identical to a sum of the second member thickness MT2 and the second spacing S2. As the second member thickness MT2 of the second channel members 214-2 are now smaller, the separation between neighboring second channel members 214-2 is now greater, changing from the first spacing S1 to a greater second spacing S2. In some implementations, a ratio of S2 to S1 (S2/S1) is between about 1.05 and about 1.3. The second pitch P2 may also be defined as a summation of the second member thickness MT2 and the second spacing S2. In some instances, the second spacing S2 may be between 6 nm and about 15 nm. In some embodiments, after the first channel members 214-1 in the first region are thinned to become the second channel members 214-2, the dielectric filler material 209 and the patterned hard mask 213 over the second region 20 are removed to expose the first channel members 214-1.

In conventional semiconductor devices or methods, channel members in different device regions have identical spacings and thicknesses. When a thicker gate dielectric layer is formed in a device region, less member-to-member separation may remain for deposition of work function metal layers and fill metal layers, resulting in reduced process windows. In addition, conventional devices rely on different work-function metal stack arrangements to vary Vt of GAA transistors. Formation of different work-function metal stacks requires deposition of multiple metal layers, selective removal of all or some of the deposited metal layers in a device region, and deposition of different metal layers in that device region. All these operations can have small process windows because member-to-member vertical spacing of GAA transistors is limited. The embodiments of the present disclosure provide GAA transistors with different threshold voltages and improved process windows. The larger second spacing S2 provide additional member-to-member vertical separation for thicker gate dielectric layers to be deposited over and around the second channel members 214-2 while still providing satisfactory process windows to form work function metal layers and fill metal layers. The thick gate dielectric layers may further increase the threshold voltage (Vt) and reduce leakage, making the GAA transistors to be fabricated in the first region 10 suitable for low-leaking, high-Vt applications, such as memory cells. In some instances, the thick gate dielectric layers may allow for high voltage applications. Compared to the GAA transistors in the first region, the GAA transistors to be fabricated in the second region 20 have thicker first channel members 214-1 and thinner gate dielectric layers, making them suitable for high performance applications, such as logic cells.

Figure 9:
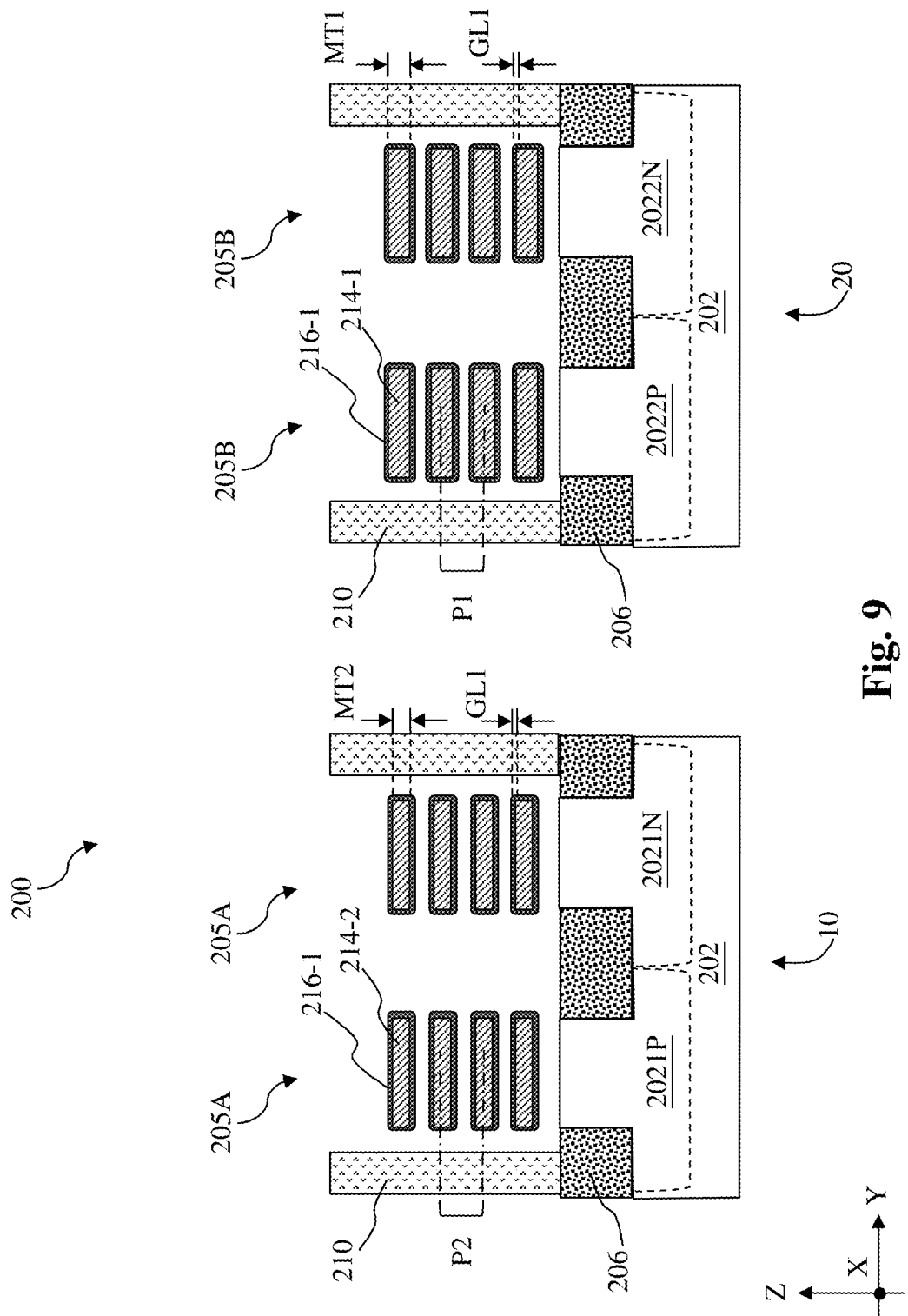

Referring to FIGS. 1 and 9, the method 100 may include a block 116A where a first gate dielectric layer 216-1 is formed over the first channel members 214-1 and the second channel members 214-2. In some embodiments, the first gate dielectric layer 216-1 may include a silicon oxide layer and a high-k dielectric layer. In some of those embodiments, the silicon oxide layer is doped with nitrogen. In some implementations, the high-k dielectric layer may include one or more metal oxides, such as ZrO, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The high-k dielectric layer has a dielectric constant greater than 9, including greater than 13. In some embodiments, the first gate dielectric layer 216-1 has a first gate dielectric layer thickness GL1.

Figure 10:
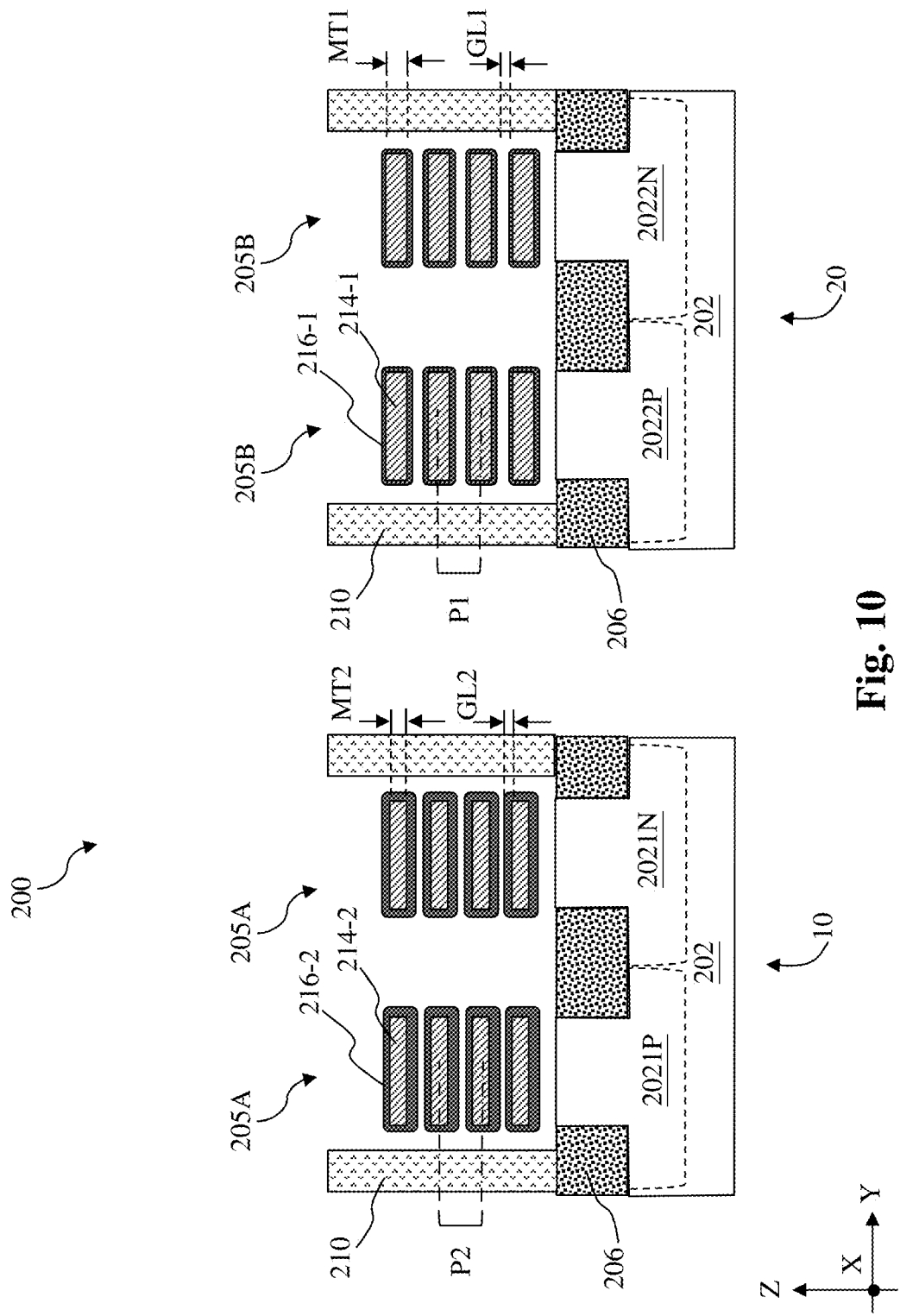

Referring to FIGS. 1 and 10, alternatively, the method 100 may include a block 116B where a second gate dielectric layer 216-2 is formed over the second channel members 214-2 and the first gate dielectric layer 216-1 is formed over the first channel members 214-1. In some embodiments, before the dielectric filler material 209 and the patterned hard mask 213 is removed from the second region 20 at the conclusion of block 114, a second gate dielectric layer 216-2 is formed over and around the second channel members 214-2. Thereafter, the channel regions in the first region 10 is masked by another patterned hard mask and the first channel members 214-1 in the second region 20 is exposed. The first gate dielectric layer 216-1 may then be formed over and around the first channel members 214-1 in the second region 20. The second gate dielectric layer 216-2 has a second gate dielectric layer thickness GL2 that is greater than the first gate dielectric layer GL1. In some embodiments, a ratio of GL2 to GL1 (GL2/GL1) may be between about 1.05 and about 1.3. In some implementations, the first gate dielectric layer 216-1 and the second gate dielectric layer 216-2 may be similar in composition while GL2 of the second gate dielectric layer 216-2 is greater than GL1 of the first gate dielectric layer 216-1. In some alternative implementations, the second gate dielectric layer 216-2 may include a thicker silicon oxide layer (with or without nitrogen doping) than the first gate dielectric layer 216-1 and a high-k dielectric layer of a similar thickness of the high-k dielectric layer in the first gate dielectric layer 216-1. Due to the thicker second gate dielectric layer 216-2, the GAA transistors to be formed in the first region 10 has a higher threshold voltage due to better DIBL performance and is suitable for applications that require low leakage, such as memory application. In addition, because of the thicker second gate dielectric layer 216-2, the GAA transistors to be formed in the first region 10 may also be suitable for high-voltage applications, such as input/output (I/O) applications. As a comparison, the GAA transistors in the second region has a lower threshold voltage and is suitable for applications that require speed and a high drive current ($I_{on}$), such as logic application.

Figure 11A:
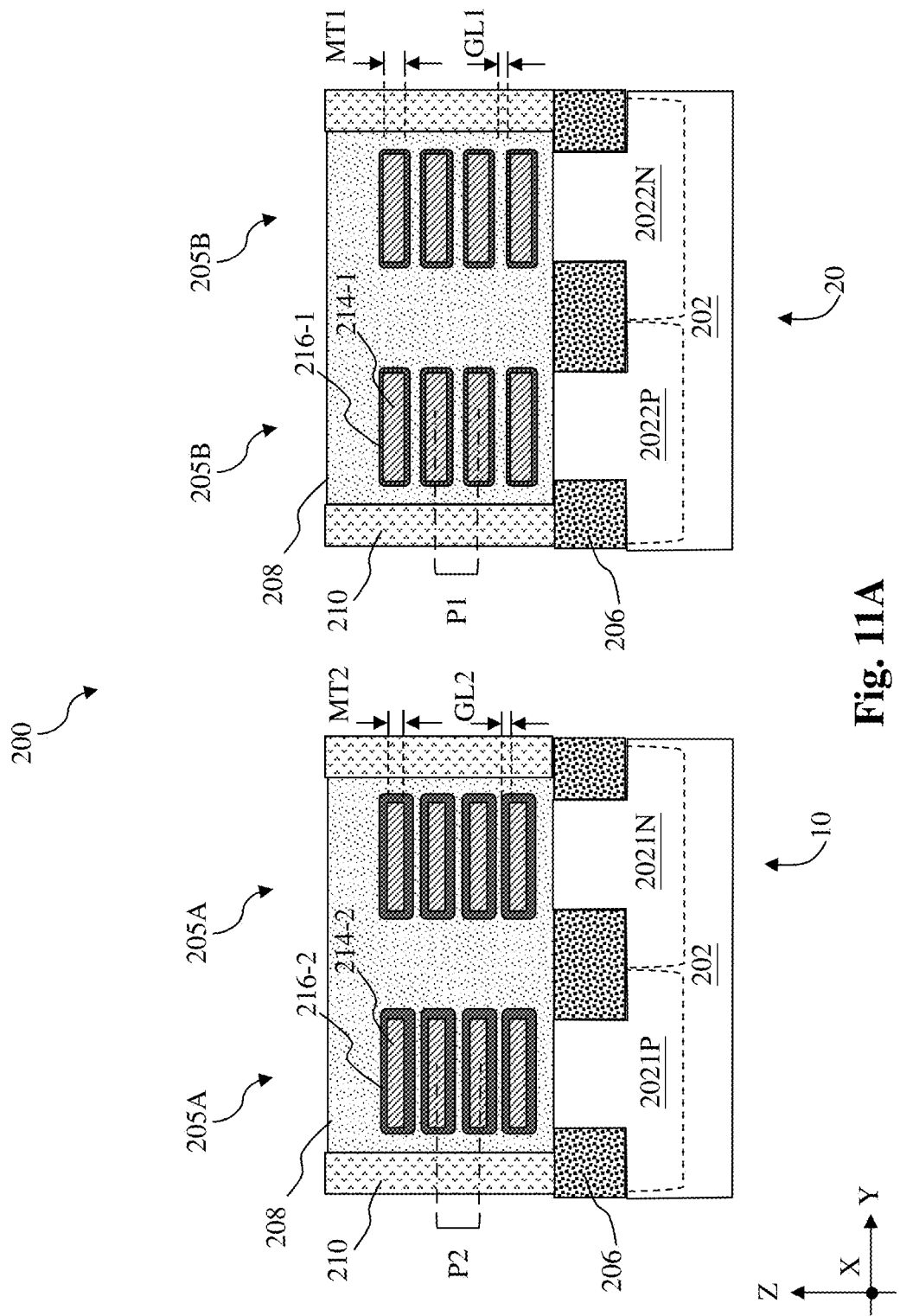
Figure 11B:
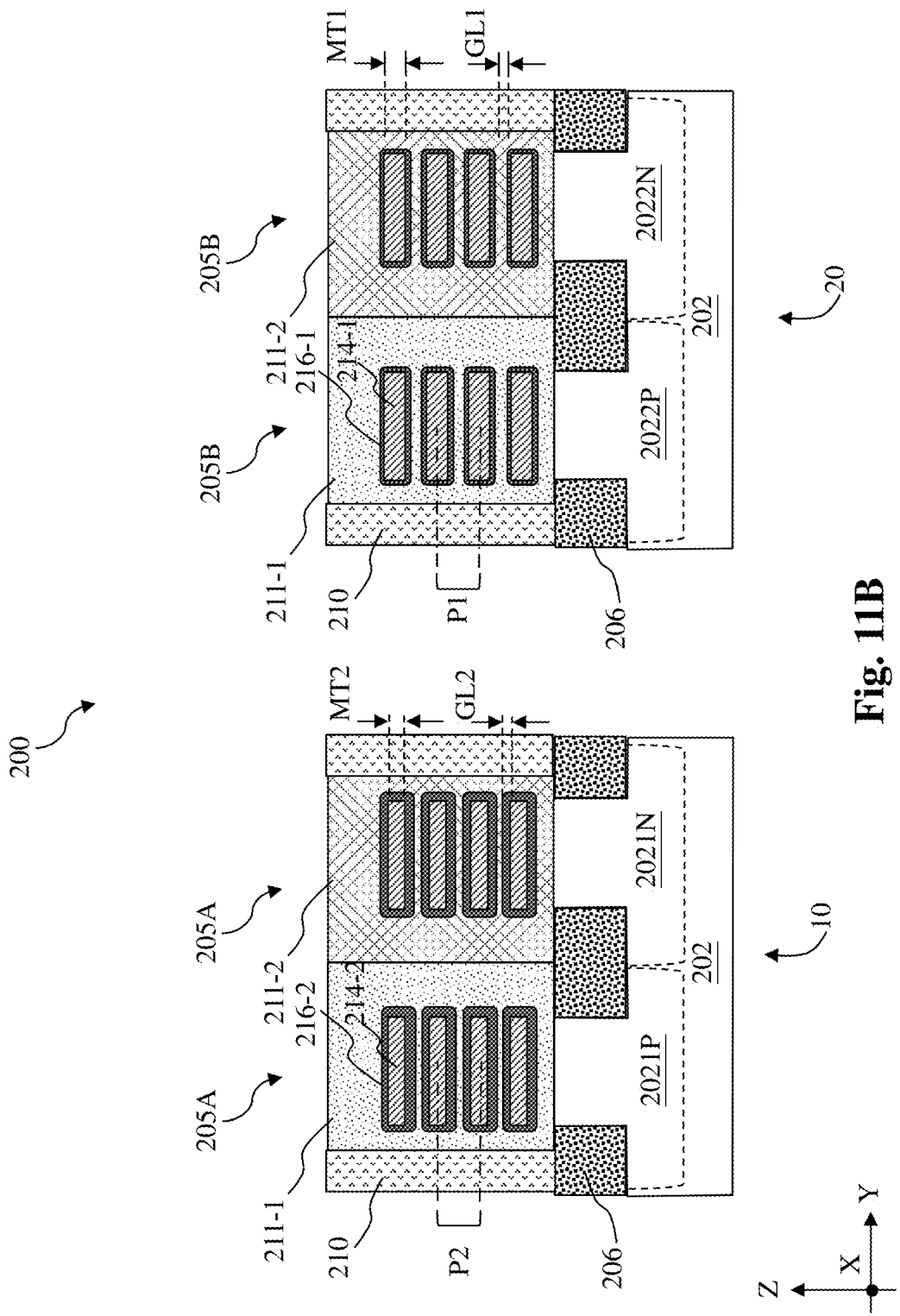

Referring to FIGS. 1, 11A and 11B, the method 100 includes a block 118 where metal gate structures are formed over the channel regions in the first region 10 and the channel region in the second region 20. In some embodiments represented in FIG. 11A, a common metal gate structure 208 may be formed in channel regions in the first region 10 and the second region. The common metal gate structure 208 may include work function metal layers and fill metal layers. The choice of material for a work function metal layer may be determined by an overall threshold voltage desired for the GAA transistor in the first region 10 or the second region 20. Exemplary p-type work function metals include TiN, TaN, Ru, Mo, Al, WN, $ZrSi_2$, $MoSi_2$, $TaSi_2$, $NiSi_2$, WN, and/or other suitable p-type work function materials. Suitable n-type work function metals include Ti, Ag, TaAl, TaAlC, TiAlN, TaC, TaCN, TaSiN, Mn, Zr, and/or other suitable n-type work function materials. Further, a fill metal layer formed over the work function metal layer may include copper (Cu), tungsten (W), aluminum (Al), cobalt (Co), and/or other suitable materials. The fill metal layer may be formed by ALD, CVD, PVD, plating, and/or other suitable processes. After the gate replacement process, a CMP process may be performed to reduce a height of the common metal gate structure 208 to a desired level.

Alternatively, in embodiments represented in FIG. 11B, instead of a common metal gate structure 208, an n-type metal gate structure 211-1 is formed over the first channel members 214-1 and the second channel members 214-2 over the p-wells (2021P and 2022P) and a p-type metal gate structure 211-2 is formed over the first channel members 214-1 and the second channel members 214-2 over n-wells (2021N and 2022N). In these alternative embodiments, the n-type metal gate structure 211-1 may include a first work function metal stack formed of layer of n-type work function metals and the p-type metal gate structure 211-2 may include a second work function metal stack formed of layers of p-type work function metals. In some implementations, the n-wells and the p-wells may be separately masked off when forming the first work function metal stack and the second work function metal stack separately. In some implementations, the difference between the n-type metal gate structure 211-1 and the p-type metal gate structure 211-2 lies substantially in the different work function metal stacks and may include a common metal fill layer. That is, even though the n-type metal gate structure 211-1 and the p-type metal gate structure 211-2 are marked with different patterns in FIG. 11B, they may have the same metal fill layer.

Referring to FIGS. 1 and 12, the method 100 includes a block 120 where further processes are performed. Such further processes may include formation of a gate-top hard mask 217 over the common metal gate structure 208 (or the n-type metal gate structure 211-1 and the p-type metal gate structure 211-2), formation of a silicide layer 224, formation of source/drain contacts 226, and formation of another ILD layer 228. In some embodiments, the source/drain contacts 226 may include one or more metal layers selected from a group that includes titanium (Ti), titanium nitride (TiN), nickel (Ni), molybdenum (Mo), platinum (Pt), cobalt (Co), ruthenium (Ru), tungsten (W), tantalum nitride (TaN), copper (Cu), or a combination thereof. FIG. 12 illustrate a first-type GAA transistor 1000 in the first region 10 and a second-type GAA transistor 2000 in the second region 20. In some embodiments, a first standard cell is defined in the first region 10 and a second standard cell is defined in the second region 20. The first standard cell and the standard cell may abut one another and are separated by an isolation structure. A suitable isolation structure may include one or more dielectric dummy gate structures, such as the dielectric dummy gate structure 218 in FIG. 12, or one or more transistors whose gates are turned off permanently. In some instances, the first standard cell may a memory cell that requires low leakage and the second standard cell may be a logic cell that requires high speed and high drive current.

Based on the above discussions, the present disclosure offers advantages over conventional semiconductor devices that rely substantially on different work function metal stacks to implement different threshold voltages. It is understood, however, that other embodiments may offer additional advantages, and not all advantages are necessarily disclosed herein, and that no particular advantage is required for all embodiments. The present disclosure puts forth a semiconductor device that includes a first-type GAA transistor to have high threshold voltage and low-leakage and a second-type GAA transistor to have low threshold voltage and high drive currents. Both formed from the same stack of alternating semiconductor layers, the first-type GAA transistor has thinner channel members and thicker gate dielectric layer and the second type GAA transistor has thicker channel members and thinner gate dielectric layer. The thinning of the channel members for the first-type GAA transistor widens the process window for formation of work function metal layers and metal fill layers even though the first-type GAA transistor has thicker gate dielectric layer.

The disclosure of the present disclosure provides embodiments of semiconductor devices and methods of forming the same. In one embodiment, a semiconductor device is provided. The semiconductor device includes a first gate-all-around (GAA) transistor comprising a first plurality of channel members; and a second GAA transistor comprising a second plurality of channel members. A pitch of the first plurality of channel members is identical to a pitch of the second plurality of channel members, and the first plurality of channel members has a first channel member thickness (MT1) and the second plurality of channel members has a second channel member thickness (MT2) greater than the first channel member thickness (MT1).

In some embodiments, a ratio of the first channel member thickness to the second channel member thickness (MT1/MT2) is between about 0.75 and about 0.90. In some implementations, the first GAA transistor further includes a first gate dielectric layer over the first plurality of channel members, the second GAA transistor further includes a second gate dielectric layer over the second plurality of channel members, and the first gate dielectric layer comprises a first gate dielectric thickness (G1) and the second gate dielectric layer comprises a second gate dielectric thickness (G2) smaller than the first gate dielectric thickness (G1). In some instances, a ratio of the first gate dielectric thickness to the second gate dielectric thickness (G1/G2) is between about 1.05 and about 1.30. In some implementations, the first plurality of channel members includes a first spacing (S1) between two neighboring channel members of the first plurality of channel members, the second plurality of channel members includes a second spacing (S2) between two neighboring channel members of the second plurality of channel members, and the first spacing (S1) is greater than the second spacing (S2). In some embodiments, a ratio of the first spacing to the second spacing (S1/S2) is between about 1.05 and about 1.3. In some implementations, each of the first plurality of channel members includes a first channel member width (W1), and each of the second plurality of channel members includes a second channel member width (W2) smaller than the first channel member width (W1). In some instances, the first GAA transistor is in a memory cell and the second GAA transistor is in a logic cell.

In another embodiment, a semiconductor device is provided. The semiconductor device includes a first gate-all-around (GAA) transistor that includes a first plurality of channel members, and a first gate dielectric layer over the first plurality of channel members; and; and a second GAA transistor that includes a second plurality of channel members and a second gate dielectric layer over the second plurality of channel members. A pitch of the first plurality of channel members is substantially identical to a pitch of the second plurality of channel members have. The first gate dielectric layer includes a first gate dielectric layer thickness (GL1) and the second gate dielectric layer includes a second gate dielectric layer thickness (GL2) smaller than the first gate dielectric layer thickness (GL1).

In some embodiments, a ratio of the first gate dielectric layer thickness to the second gate dielectric layer thickness (GL1/GL2) is between about 1.05 and about 1.30. In some embodiments, the first plurality of channel members has a first channel member thickness (MT1) and the second plurality of channel members has a second channel member thickness (MT2) greater than the first channel member thickness (MT1). In some instances, a ratio of the first channel member thickness to the second channel member thickness (MT1/MT2) is between about 0.75 and about 0.9. In some embodiments, each of the first plurality of channel members includes a first channel member width (W1), each of the second plurality of channel members includes a second channel member width (W2), and a ratio of the second channel member width to the first channel member width (W2/W1) is between about 1.3 and about 10. In some implementations, the semiconductor device further includes a first gate structure over the first gate dielectric layer, and a second gate structure over the second gate dielectric layer. The first gate structure includes a first work function metal layer stack and the second gate structure includes a second work function metal layer stack different from the first work function metal layer stack. In some embodiments, the first GAA transistor is in a first standard cell and the second GAA transistor is in a second standard cell separated from the first standard cell by an isolation feature.

In a further embodiment, a method is provided. The method includes forming a plurality of alternating semiconductor layers over a first region and a second region of a substrate, the plurality of alternating semiconductor layers comprising a plurality of first semiconductor layers interleaved by a plurality of second semiconductor layers; patterning the plurality of alternating semiconductor layers over the first region to form a first active region; patterning the plurality of alternating semiconductor layers over the second region to form a second active region; releasing the plurality of first semiconductor layers from the plurality of second semiconductor layers to form first channel members in a first channel region of the first active region and in a second channel region of the second active region; and thinning the first channel members in the first channel region to form second channel members.

In some embodiments, the thinning of the first channel members in the first channel region includes masking the first channel members in the second channel region. In some implementations, the method further includes forming a first gate dielectric layer over the second channel members in the first channel region; and forming a second gate dielectric layer over the first channel members in the second channel region. In some instances, a thickness of the first gate dielectric layer is greater than a thickness of the second gate dielectric layer. In some implementations, the forming of the second gate dielectric layer includes masking the first channel members in the second channel region. In some embodiments, the method further includes forming a first gate structure over the second gate dielectric layer in the first channel region; and forming a second gate structure on the first gate dielectric layer in the second channel region. The first gate structure includes a first work function metal stack and the second gate structure includes a second work function metal stack different from the first work function metal stack.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:

1. A method, comprising:
   forming a semiconductor layer stack over a first region and a second region on a substrate, the semiconductor layer stack comprising a plurality of first semiconductor layers are interleaved by a plurality of second semiconductor layers;
   patterning the semiconductor layer stack and a portion of the substrate to form a first fin-shaped structure over the first region and a second fin-shaped structure over the second region, each of the first fin-shaped structure and the second fin-shaped structure comprising a channel region and a source/drain region;
   forming a dummy gate stack over the channel regions of the first fin-shaped structure and the second fin-shaped structure, the dummy gate stack extending along a first direction;
   performing a gate cut process to separate the dummy gate stack by a plurality of gate end dielectric features into a first dummy gate segment over the channel region of the first fin-shaped structure and a second dummy gate segment over the channel region of the second fin-shaped structure;
   removing the first dummy gate segment and the second dummy gate segment;
   selectively removing the second semiconductor layers in the channel regions to form first nanostructures in the first region and the second region;
   selectively thinning the first nanostructures in the first region to form second nanostructures; and
   forming a gate electrode layer over the second nanostructures in the first region and the first nanostructures in the second region.

2. The method of claim 1,
   wherein the first semiconductor layers comprise silicon,
   wherein the second semiconductor layers comprise silicon germanium.

3. The method of claim 1, wherein, after the selectively thinning, each of the second nanostructures has a first thickness and each of the first nanostructures has a second thickness greater than the first thickness.

4. The method of claim 3, wherein, after the selectively thinning, a ratio of the first thickness to the second thickness is between about 0.75 and 0.9.

5. The method of claim 1, wherein, after the selectively thinning, the second nanostructures comprise a first spacing and the first nanostructures comprise a second spacing smaller than the first spacing.

6. The method of claim 5, wherein a ratio of the first spacing to the second spacing is between about 1.05 and about 1.3.

7. The method of claim 1, further comprising:
   forming a first gate dielectric layer over the first nanostructures; and
   forming a second gate dielectric layer over the second nanostructures,
   wherein the first gate dielectric layer comprises a first dielectric thickness and the second gate dielectric layer comprises a second dielectric thickness greater than the first dielectric thickness.

8. The method of claim 7, wherein a ratio of the second dielectric thickness to the first dielectric thickness is between about 1.05 and about 1.3.

9. A method, comprising:
forming a semiconductor layer stack over a first region and a second region on a substrate, the semiconductor layer stack comprising a plurality of first semiconductor layers are interleaved by a plurality of second semiconductor layers;
patterning the semiconductor layer stack and a portion of the substrate to form a first fin-shaped structure over the first region and a second fin-shaped structure over the second region, each of the first fin-shaped structure and the second fin-shaped structure comprising a channel region and a source/drain region;
forming a dummy gate stack over the channel regions of the first fin-shaped structure and the second fin-shaped structure, the dummy gate stack extending along a first direction;
performing a gate cut process to separate the dummy gate stack by a plurality of gate end dielectric features into a first dummy gate segment over the channel region of the first fin-shaped structure and a second dummy gate segment over the channel region of the second fin-shaped structure;
removing the first dummy gate segment and the second dummy gate segment;
selectively removing the second semiconductor layers in the channel regions to form first nanostructures in the first region and the second region; and
selectively thinning the first nanostructures in the first region to form second nanostructures,
wherein the first fin-shaped structure and the second fin-shaped structure extend lengthwise along a first direction,
wherein the first fin-shaped structure comprises a first fin width along a second direction perpendicular to the first direction and the second fin-shaped structure comprises a second fin width along the second direction,
wherein the second fin width is greater than the first fin width.

10. The method of claim 9, wherein a ratio of the second fin width to the first fin width is between about 1.3 and about 10.

11. The method of claim 9, wherein, after the selectively thinning, each of the second nanostructures has a first thickness and each of the first nanostructures has a second thickness smaller than the first thickness.

12. The method of claim 11, wherein, after the selectively thinning, a ratio of the first thickness to the second thickness is between about 0.75 and 0.9.

13. The method of claim 9, wherein, after the selectively thinning, each of the first nanostructures has a first spacing and each of the second nanostructures comprise a second spacing greater than the first spacing.

14. The method of claim 9, further comprising:
forming a first gate dielectric layer over the first nanostructures; and
forming a second gate dielectric layer over the second nanostructures,
wherein the first gate dielectric layer comprises a first dielectric thickness and the second gate dielectric layer comprises a second dielectric thickness greater than the first dielectric thickness.

15. The method of claim 14, wherein a ratio of the second dielectric thickness to the first dielectric thickness is between about 1.05 and about 1.3.

16. A method, comprising:
forming a plurality of alternating semiconductor layers over a first region and a second region of a substrate, the plurality of alternating semiconductor layers comprising a plurality of first semiconductor layers interleaved by a plurality of second semiconductor layers;
patterning the plurality of alternating semiconductor layers over the first region to form a first active region extending lengthwise along a first direction and having a first width along a second direction perpendicular to the first direction;
patterning the plurality of alternating semiconductor layers over the second region to form a second active region extending lengthwise along the first direction and having a second width along the second direction;
releasing the plurality of first semiconductor layers from the plurality of second semiconductor layers to form first channel members in a first channel region of the first active region and in a second channel region of the second active region; and
thinning the first channel members in the first channel region to form second channel members,
wherein the first width is greater than the second width.

17. The method of claim 16, wherein the thinning of the first channel members in the first channel region comprises masking the first channel members in the second channel region.

18. The method of claim 16, further comprising:
forming a first gate dielectric layer over the second channel members in the first channel region; and
forming a second gate dielectric layer over the first channel members in the second channel region,
wherein a thickness of the first gate dielectric layer is greater than a thickness of the second gate dielectric layer.

19. The method of claim 18, wherein the forming of the second gate dielectric layer comprises masking the first channel members in the second channel region.

20. The method of claim 18, further comprising:
forming a first gate structure over the first gate dielectric layer in the first channel region; and
forming a second gate structure on the second gate dielectric layer in the second channel region,
wherein the first gate structure comprises a first work function metal stack,
wherein the second gate structure comprises a second work function metal stack different from the first work function metal stack.

* * * * *